United States Patent [19]

Ishida et al.

[11] Patent Number: 5,703,295
[45] Date of Patent: Dec. 30, 1997

[54] VIBRATION SENSING METHOD AND APPARATUS THEREFOR

[75] Inventors: Naruo Ishida; Yoshio Saijyo; Shingo Arakawa, all of Fukuyama; Kimiaki Watanabe; Hidehiro Inaba, both of Fujinomiya, all of Japan

[73] Assignees: NKK Corporation, Tokyo; Kabushiki Kaisha Fuji Ceramics, Fujinomiya, both of Japan

[21] Appl. No.: 563,581

[22] Filed: Nov. 28, 1995

[30] Foreign Application Priority Data

Nov. 28, 1994 [JP] Japan .................. 6-292541

[51] Int. Cl.$^6$ .................. G01L 1/00; G01H 13/00
[52] U.S. Cl. .................. 73/593; 340/682; 340/683; 364/707; 73/660; 73/DIG. 4; 310/339
[58] Field of Search .................. 73/1 DV, 593, 73/654, 660, 651; 364/508, 550, 707; 340/683, 682; 310/339

[56] References Cited

U.S. PATENT DOCUMENTS

| H372 | 11/1987 | Campbell | 310/339 |
| 4,237,454 | 12/1980 | Meyer | 73/593 |
| 4,510,484 | 4/1985 | Snyder | 340/58 |
| 5,578,766 | 11/1996 | Kondo | 310/339 |
| 5,578,889 | 11/1996 | Epstein | 310/339 |

FOREIGN PATENT DOCUMENTS 63-42427  2/1988  Japan .

Primary Examiner—Hezron E. Williams
Assistant Examiner—Rose M. Miller
Attorney, Agent, or Firm—Frishauf, Holtz, Goodman, Langer & Chick

[57] ABSTRACT

A vibration sensing apparatus including an acceleration sensor 2 for outputting a sensing signal corresponding to a vibrating acceleration, a level discriminator 3 for generating an output when the output level of the signal from the acceleration sensor 2 exceeds a preset reference level, a display unit 4 for displaying the output of the level discriminator 3, a piezoelectric ceramic power generating unit 5 using piezoelectric ceramics for generating a charge when it is subjected to vibration, and a conversion unit 6 for converting the charge generated by the piezoelectric ceramic power generating unit 5 into DC power, the DC power being supplied to the level discriminator and to the display unit as power to be consumed by them.

2 Claims, 3 Drawing Sheets

VIBRATION SENSING METHOD AND APPARATUS THEREFOR

BACKGROUND OF THE INVENTION

1. Field of the Invention

The present invention relates to a vibration sensing method operated by a spontaneously generated power source and an apparatus therefor. More specifically, the present invention relates to a vibration sensing method and an apparatus for the method used to sense the vibration of a bearing or the like mounted on a rotary machine.

2. Description of the Related Arts

When a bearing or the like mounted on a rotary machine is worn and deteriorated as they are used, there is a possibility that the rotary machine is stopped or causes a serious accident as the wear of them grows worse.

When the wear of the bearing mounted on the rotary machine and the like grows worse, the vibration of the bearing is increased. To cope with this problem, conventionally, a sensor such as an acceleration sensor or the like is periodically attached to the bearing of the rotary machine, a signal sensed by the sensor is analyzed by a vibration analyzing apparatus or a vibration sensing apparatus integrally including from a vibration sensor to a vibration level display unit which is disclosed in Japanese Patent Application Laid-Open No. 63-42427 to determine whether the bearing of the rotary machine is worn and deteriorated or not and how the wear of the bearing grows worse and execute the replacement and the like of the bearing, if necessary.

The vibration sensing apparatus shown in the above Japanese Patent Publication is arranged such that vibration is sensed by a piezoelectric type vibrating element and a sensing signal is amplified and then a vibration level is displayed on a liquid crystal display (LCD) unit. Further, a battery is contained as a driving power source, and there is employed a method of applying power each time measurement is executed and automatically shutting off the power when a predetermined period of time elapses after the completion of the measurement to prolong the life of the battery.

However, a measurement start signal must be generated by operating a manual switch for the vibration sensing apparatus to start measurement. Therefore, when the vibration sensing apparatus is attached to the bearing or the like of a dangerous rotary machine, it is necessary to interrupt the operation of equipment such as the rotary machine or the like once, operate the manual switch and then resume the operation of the equipment.

Consequently, the intrinsic object of the vibration sensing apparatus for sensing vibration while equipment is continuously operated cannot be achieved, and further since the power source is composed of the battery, when the battery life is ended, the equipment must be stopped to replace the battery and thus this vibration sensing apparatus is not applicable to a continuous processing line.

There are many locations where the vibration of bearings and the like must be sensed in a factory and it is required to securely sense an abnormal state whenever it occurs and continuously measure vibration in order to maintain manufacturing activity.

FIG. 6 is a conceptual view of the measurement of vibration of a bearing or the like by a conventional method. When it is intended to manage acceleration sensors 2 attached to respective bearings (bearing surfaces) 1 by a single vibration analyzing apparatus 30 or the like as shown in FIG. 6, a problem arises in that the respective acceleration sensors 2 must be connected to the vibration analyzing apparatus 30 located in a central control room through cables, respectively and thus a large amount of cost is necessary.

Further, when the vibration analyzing apparatus is carried to the vicinity of the respective accelerator sensors for measurement, there is a problem that a large amount of time and labor is required.

Although the vibration sensing apparatus, in which the vibration sensor to the display unit are integrally arranged, disclosed in the above Japanese Patent Publication employs the method of applying power each time measurement is executed and automatically shutting off the power when a predetermined period of time elapses after the completion of the measurement to prolong the life of the battery, this method has a problem that it cannot continuously measure and monitor equipment as well as a job for applying power each time measurement is executed is needed.

Further, a problem arises in that there is a danger that an operator may be caught in a machine under a rotary body depending upon the location where the rotary body is installed. In addition, there is also a problem that since the life of the bearing or the like of the rotary machine is changed depending upon the net working rate and the loaded state of equipment and it is unknown when an abnormal state is caused, when the abnormal state arises, power is not applied and the abnormal state cannot be sensed, and the like.

SUMMARY OF THE INVENTION

An object of the present invention is to provide a vibration sensing method and apparatus capable of monitoring the state of the bearing or the like of equipment being continuously operated at all times and securely sensing and displaying abnormal vibration generated when the bearing or the like is worn and deteriorated without requiring time, labor and cost for the check of vibration and without the need of taking the life of a power source into consideration.

To achieve the above object, the present invention provides a vibration sensing method which comprises the steps of:

(a) sensing a signal corresponding to a vibrating acceleration to output the signal;

(b) discriminating a level of the signal which is outputted in the step (a) to generate an output when said level exceeds a preset reference level;

(c) displaying the output of the step (b);

(d) generating a charge by power generating means comprising piezoelectric ceramics when vibration is applied thereto;

(e) converting the charge generated by said power generating means into DC power; and (f) supplying the converted DC power to the step (b) and the step (c) as spontaneously generated power. Further, the present invention provides a vibration sensing apparatus which comprises:

(a) an acceleration sensor for sensing a signal corresponding to a vibrating acceleration to output the signal;

(b) a level discriminator for discriminating a level outputted from said acceleration sensor and generating an output when said level exceeds a preset reference level;

(c) a display unit for displaying the output of the level discriminator;

(d) power generating means using piezoelectric ceramics for generating a charge when vibration is applied thereto;

(e) means for converting the charge generated by said power generating means into DC power; and (f) means for supplying the converted DC power to said level discriminator and said display unit as spontaneously generated power.

The power generating means comprises a sheet-shaped piezoelectric ceramic elements arranged as a bimorph structure, a means for fixing an end of the piezoelectric ceramic elements and a deadweight attached to the other end of the piezoelectric ceramic elements. A charge is generated by a bending vibration of said piezoelectric ceramic elements.

DESCRIPTION OF PREFERRED EMBODIMENTS

Figure 1:
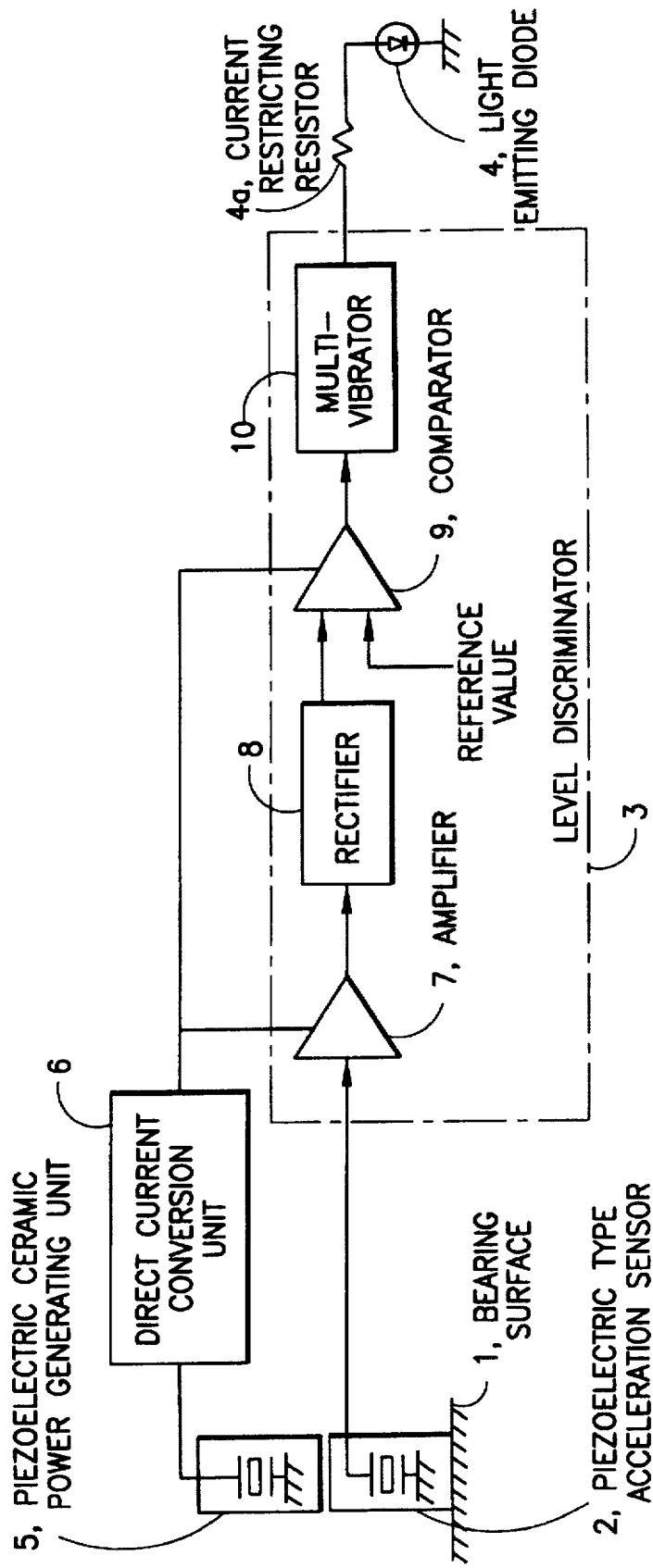
FIG. 1 is a block diagram explaining a vibration sensing method and apparatus operated by a spontaneously generated power source according to the present invention.

In the present invention, an acceleration sensing means outputs a sensing signal corresponding to a vibrating acceleration, a level discriminating means generates an output when an output level from the acceleration sensing means exceeds a preset reference level, and a display means displays the output from the level discriminating means. For the purpose of sensing and displaying vibration by a spontaneously generated power, when a piezoelectric power generating means using piezoelectric ceramic is subjected to vibration, a charge is generated by the means, the charge generated by the piezoelectric ceramic power generating unit is converted into DC power by a direct current conversion means and the DC power is applied to the level discriminating means and display means to sense and display the vibration.

Consequently, since all the power consumption in a vibration sensing apparatus can be sufficiently covered by the power spontaneously generated in the apparatus, the vibration sensing apparatus can monitor the state of a bearing and like mounted on continuously operating equipment and securely sense and display the abnormal vibration of it without the need of taking the life of a power source such as a battery and the like into consideration.

In the present invention, the vibration sensing apparatus, which includes an acceleration sensor for outputting a sensing signal corresponding to a vibrating acceleration, a level discriminator for generating an output when an output level from the acceleration sensor exceeds a preset reference level, a display unit for displaying the output from the level discriminator, a piezoelectric ceramic power generating unit using piezoelectric ceramic for generating a charge when it is subjected to vibration, and a direct current conversion unit 6 for converting the charge generated by the piezoelectric ceramic power generating unit into DC power and applies the DC power to the level discriminator and the display unit, is attached to each of a multiplicity of bearings or the like. As a result, since the wear and deterioration of the bearings or the like can be found at their initial step only by visually checking them periodically, e.g. once a day, time and labor are reduced as compared with a conventional apparatus and productively is improved as well as no check cost is necessary, by which manufacturing cost is reduced.

Further, in the present invention, since the piezoelectric ceramic power generating unit comprises sheet-shaped piezoelectric ceramic elements arranged as a bimorph structure each having one end fixed and the other end provided with a deadweight and generates a charge by the bending vibration of the piezoelectric ceramic elements, when one of the elements is expanded, the other element is compressed. As a result, the elements can obtain a charge twice that obtained by a single element.

Further, the sheet-shaped piezoelectric ceramic elements generate a larger charge when they have a larger amount of a deflecting amplitude. Thus, the deflecting amplitude can be increased in such as manner that a deadweight is attached to the other end of cantilevered vibration elements and the elements are resonated in the ordinary vibration frequency zone of a bearing or the like by adjusting the weight of the deadweight, by which a generated charge can be also increased.

According to the present invention, a plurality of piezoelectric ceramic power generating units may be provided and charges generated therefrom may be added.

Further, according to the present invention, the display means and level discriminating means are arranged to consume a minimum amount of power required so that all the power consumption in the vibration sensing apparatus can be covered by power generated in the apparatus.

It is confirmed, for example, that when the display unit is composed of a high luminance type light emitting diode which is lit by being applied with a current of about 1 mA for a short time (for example, 10 msec.) at every predetermined cycle (for example, every two seconds), the diode can be visually recognized. Further, when each element of the level discriminator is composed of a C-MOS element, the total current consumed by the display unit and level discriminator can be suppressed to about 10 μA in average.

All the power consumption in the vibration sensing apparatus can be sufficiently covered by power generated in the apparatus by increasing an amount of generated charge as much as possible and suppressing power consumption to an allowable minimum level.

FIG. 1 is a block diagram explaining the vibration sensing method and apparatus operated by spontaneously generated power according to the present invention. In FIG. 1, numeral 1 denotes a bearing (bearing surface) of a rotary machine as a vibration source, numeral 2 denotes an piezoelectric type acceleration sensor, numeral 3 denotes a level discriminator including an amplifier 7, a rectifier 8, a comparator 9 and a multivibrator 10. Numeral 4 denotes a light emitting diode 4, numeral 4a denotes a current restricting resistor, numeral 5 denotes a piezoelectric ceramic power generating unit 5 and numeral 6 denotes a direct current conversion unit 6

In FIG. 1, the piezoelectric type acceleration sensor 2 is attached to the bearing 1 as the vibration source and a sensing output from the sensor 2 is supplied to the level discriminator 3. When the output level of the piezoelectric type acceleration sensor 2 exceeds a preset reference level, the level discriminator 3 lights the light emitting diode 4.

The piezoelectric ceramic power generating unit 5 generates an AC charge in response to the vibration of the bearing 1 likewise the piezoelectric type acceleration sensor 2 and the generated AC charge is converted into a DC voltage by the direct current conversion unit 6 and supplied as power to be consumed by the level discriminator 3. Note, a current flowing to the light emitting diode 4 is supplied from the level discriminator 3.

Further, the vibrating acceleration generated by the bearing when it is deteriorated is about 1-2 G, all the power consumption in the vibration sensing apparatus can be covered by an amount of charge generated by the piezoelectric ceramic power generating unit 5 at the time, which will be described later.

The level discriminator 3 composed of the amplifier 7, rectifier 8, comparator 9 and multivibrator 10 amplifies and rectifies the output signal from the acceleration sensor 2 which corresponds to a vibrating acceleration of the bearing and inputs the same to one of the inputs of the comparator 9. Since the preset reference value is applied to the other input of the comparator 9, it compares the value output from the rectifier 8 with the reference value to thereby determine which of the signal values is larger. The reference value for comparison may be set to any arbitrary value.

Since the reference value is set larger than the value output from the rectifier 8 when the vibration of the bearing is in a normal state, that is, when the output from the acceleration sensor 2 is small, the output from the comparator 9 is at a low level.

Further, when the vibration of the bearing is increased due to its wear and deterioration, since the output value from the rectifier 8 exceeds the reference value, the output from the comparator 9 becomes a high level to thereby operate the multivibrator 10.

Since the multivibrator 10 generates a pulse voltage once every two seconds for a short time and flows a current to the light emitting diode 4 through the current restricting resistor 4a to light it, a watchman can visually find the wear and deterioration of the bearing with ease.

Note, a method of reducing an average current to be flowed to the light emitting diode 4 will be described later.

Figure 2:
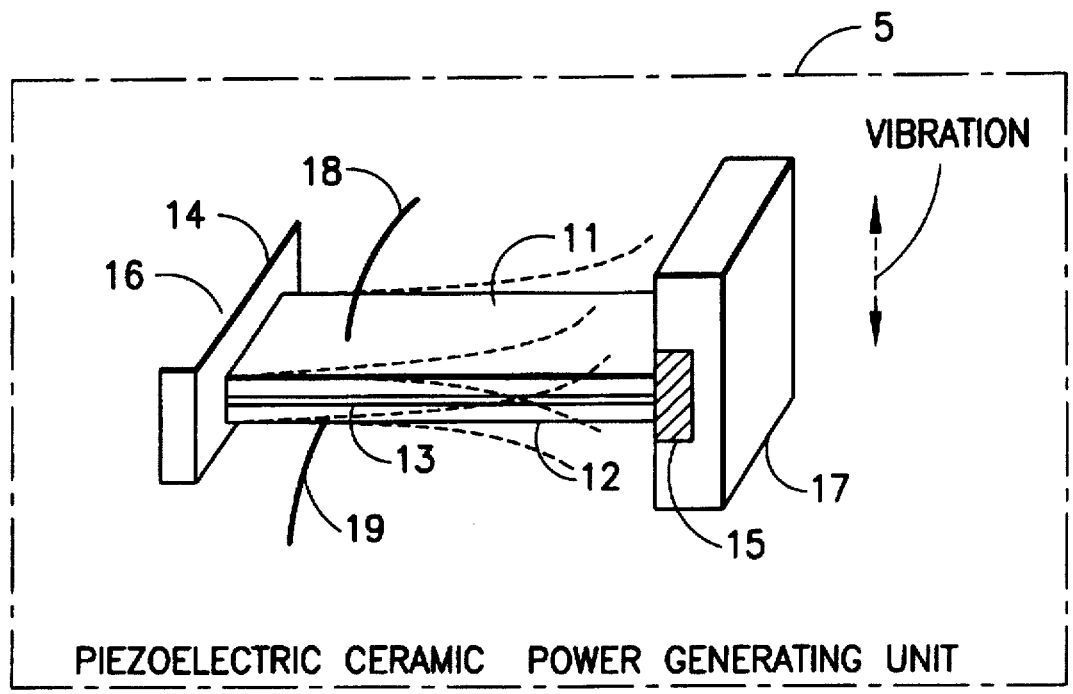
FIG. 2 is a view showing an example of a piezoelectric ceramic power generating unit according to the present invention.

FIG. 2 is a view showing an example of the piezoelectric ceramic power generating unit according to the present invention.

In FIG. 2, the piezoelectric ceramic power generating unit 5 is arranged such that rectangular sheet-shaped piezoelectric ceramics 11, 12 each having electrodes formed on both surfaces are bonded on a metal sheet 13 to arrange it as a bimorph structure and an end of the piezoelectric ceramics is fixed to a frame 16 through an adhesive 14 such as an epoxy resin or the like, by which the piezoelectric ceramics are also insulated. A metal deadweight 17 is attached to the other end of the piezoelectric ceramics through an adhesive 15 such as an epoxy resin or the like, by which the piezoelectric ceramics are also insulated.

When the piezoelectric ceramic power generating unit 5 arranged as described above is subjected to vertical vibration through the frame 16, the piezoelectric ceramics 11, 12 generate a charge by bending vibration shown by a dotted line. The thus generated charge is taken out through lead wires 18, 19 and supplied to the direct current conversion unit 6.

In the bimorph structure shown in FIG. 2, when one of the sheet-shaped piezoelectric ceramics 11, 12 is expanded by bending vibration, the other of them is compressed so that they are deformed in opposite directions, respectively so as to generate the charge. Thus, they generate a charge twice that generated when a single piezoelectric ceramic is employed. Further, the provision of the metal sheet 13 between the two piezoelectric ceramics 11, 12 eases the attachment of the piezoelectric ceramics as well as increases mechanical strength.

Further, when the sheet-shaped piezoelectric ceramic vibrating elements have a larger deflecting amplitude, a larger amount of charge is generated by them. Therefore, a deadweight is attached to an end of cantilever vibrating elements and its weight is adjusted to cause the vibrating elements to resonate in an ordinary vibration frequency zone (about 10-100 Hz) of a bearing or the like in order to obtain a deflecting amplitude as large as possible by vibration.

Figure 3:
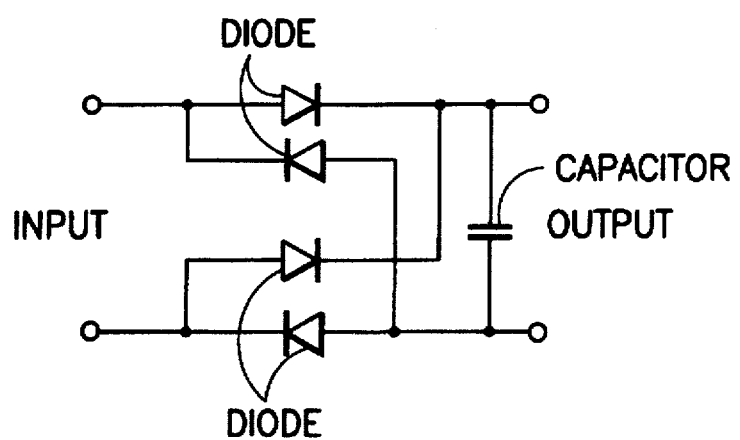
FIG. 3 is a circuit diagram showing an example of a direct current conversion unit by the spontaneously generated power according to the present invention.

FIG. 3 is a circuit diagram showing an example of the direct current conversion unit 6 according to the present invention which is composed of four full-wave-rectifying diodes and a smoothing capacitor and outputs an AC voltage input thereto after converting it into a DC voltage. The DC output voltage is supplied to the level discriminator 3.

The characteristics of a piezoelectric ceramic power source made as a prototype for the vibration sensing apparatus according to the present invention will be described below.

A bimorph structure was arranged by boding two piezoelectric ceramic sheets of the structure shown in FIG. 2 each having a width of 14 mm, a length of 17.5 mm and a thickness of 0.22 mm to a phosphor bronze sheet having a thickness of 0.1 mm and a brass deadweight of 14 g was attached to an extreme end of the piezoelectric ceramic sheets to prepare a piezoelectric ceramic power generating unit having one end fixed.

When the characteristics of the thus prepared piezoelectric ceramic power generating unit were examined, a capacitance of 12.5 µF and a charge sensitivity of 100 nC (nanocoulomb)/G were obtained. When the piezoelectric ceramic power generating unit was vibrated at a frequency of 60 Hz and a vibrating acceleration of 1 G and the output therefrom was connected to the input of the direct current conversion unit 6 of FIG. 3, a DC voltage of 8 V was obtained in a no load state without any load connected to the output of the direct current conversion unit 6 and a current of about 20 µA flowed when the output was short circuited. Further, when a resistor of 25 KΩ was connected to the output, a voltage across the resistor was DC 3 volt and a current of 12 µA continuously flowed to the resistor.

That is, it was confirmed that the piezoelectric ceramic power generating unit 5 and the Direct current conversion unit 6 shown in FIG. 2 and FIG. 3 could be used as a power source of DC 3 V and 12 µA.

Figure 5:
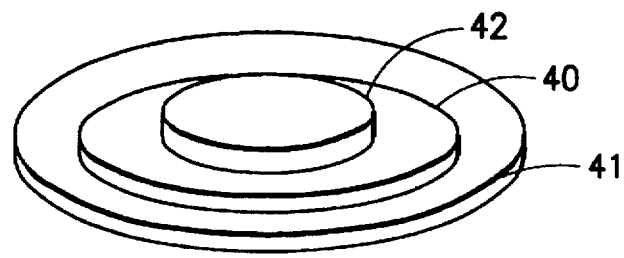
FIG. 5 is a view showing another example of the piezoelectric ceramic power generating unit according to the present invention.
Figure 6:
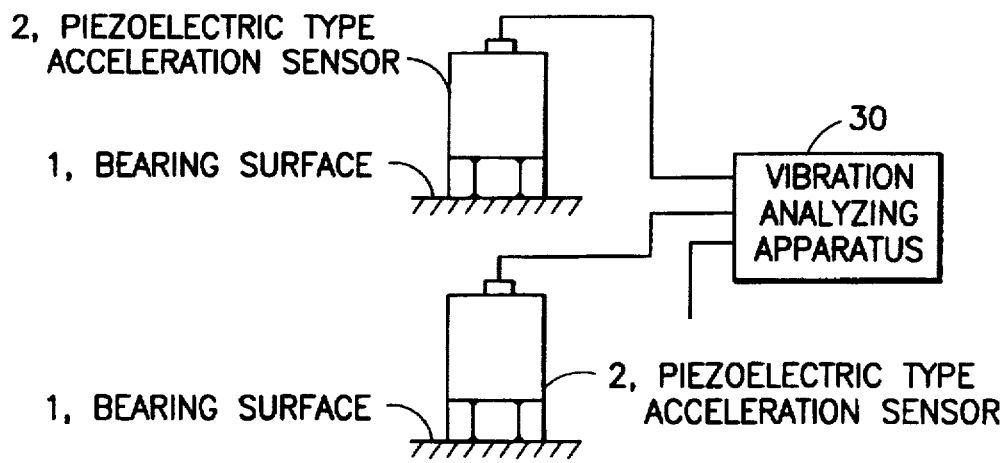
FIG. 6 is a conceptual view of the measurement of vibration of a bearing or the like by a conventional method.

FIG. 5 is a view showing another example of the piezoelectric ceramic power generating unit according to the present invention. In this example, a piezoelectric ceramic 40 is bonded to a disc-shaped metal sheet 41 and a deadweight 42 is bonded at the center thereof to support a potion or the periphery of the metal sheet 41.

Next, a method of lighting the light emitting diode 4 and the average value of a total current consumed will be described.

When the light emitting diode 4 is composed of a high luminance type light emitting diode and lit for 10 ms by being supplied with a current of 1 mA, the lit state of the diode can be visually confirmed. When the light emitting diode is lit once every two seconds, an average current amounts to 5 μA.

When the amplifier 7 and the comparator 9 are composed of, for example, C-MOS operational amplifiers which consume a very small amount of a current (e.g. Model MAX 406 made by Maxim Corp.) and the multivibrator 10 is composed of, for example, a C-MOS logic IC and outputs a pulse having a pulse width of 10 ms at a cycle of 2 seconds to minimize the power consumption of the level discriminator 3, the level discriminator 3 can be composed of a known circuit of low power consumption.

When the light emitting diode is lit once every two seconds by the level discriminator 3 arranged as described above, the average value of a total current consumed by the vibration sensing apparatus is about 10 μA.

When the vibration of a bearing is increased by its wear and deterioration, since a vibrating acceleration is generated in a magnitude of about 1–2 G, power of DC 3 V and 12–24 μA, which can cover all the current consumed by the vibration sensing apparatus, can be obtained after an amount of charge generated by the piezoelectric ceramic power source is converted into the DC current.

Figure 4:
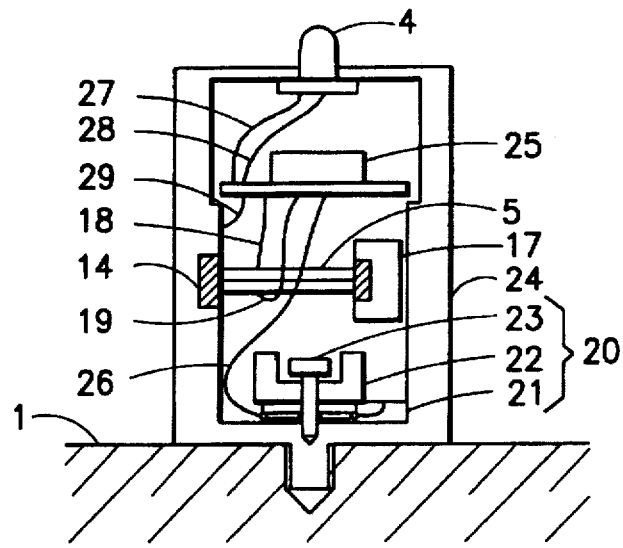
FIG. 4 is a view showing an example of the structure of a vibration sensing apparatus operated by the spontaneously generated power source according to the present invention.

FIG. 4 is a view showing an example of the structure of the vibration sensing apparatus operated by spontaneously generated power according to the present invention.

In FIG. 4, a piezoelectric type acceleration sensor is composed of a piezoelectric ceramic 21, a load mass 22 and a screw 23. The output of the piezoelectric type acceleration sensor 2 is connected to a circuit unit 25 through a lead wire 26, a metal case 24 and a lead wire 29.

The circuit unit 25 is composed of a level discriminator and a direct current conversion unit and the output of the acceleration sensor is connected to the input terminal of the amplifier of the level discriminator and a light emitting diode 4 is connected to the output terminal of a multivibrator through lead wires 27, 28.

A piezoelectric ceramic power generating unit 5 is composed of a bimorph type piezoelectric ceramic having two piezoelectric ceramic sheets bonded to a metal sheet and a deadweight 17 and an end of the piezoelectric ceramic power generating unit 5 is fixed to the metal case 24 through an epoxy resin 14, by which the generating unit 5 is also insulated. A charge generated by vibration is supplied to the circuit unit 25 through lead wires 18, 19 and serves as power to the circuit unit.

The vibration sensing apparatus of FIG. 4 is fixed to a bearing 1 by a mounting screw disposed to the bottom of the metal case 24. When the bearing 1 is worn and deteriorated, its vibration is increased and a signal larger than a preset value is input to the comparator in the level discriminator 3, a light emitting diode disposed on the metal case 24 is lit by the charge serving power which was generated by the piezoelectric ceramic power source subjected to the vibration, so that the wear and deterioration of the bearing can be visually found.

Note, the example of FIG. 4 shows an example that only one set of the piezoelectric ceramic power generating unit 5 is provided in the metal case 24, the present invention is not limited thereto. In general, although the amount of charge generated by a piezoelectric ceramic is increased in proportion to the dimension (width×length) of a piezoelectric ceramic sheet constituting it and its deflecting amplitude, when a space sufficient to obtain a desired dimension and amplitude is not available in the metal case 24, a plurality of piezoelectric ceramic power generating units 5 may be provided and charges generated therefrom may be added.

Note, in this case, directions in which the piezoelectric ceramic power generating units 5 are mounted are not always the same directions. That is, rectangular piezoelectric ceramic sheets may be mounted in an X-axis direction and a Y-axis direction separately with respect to vibration in a Z-axis direction.

Note, when a wide vibration frequency zone is desired to be sensed and this zone cannot be covered by the resonating zone of a single piezoelectric ceramic power generating unit 5, a plurality of piezoelectric ceramic power generating units each having a different resonant zone such as a low resonant zone, high resonant zone and the like may be provided and charges generated therefrom may be added.

Since a reference level (in general, referred to as a threshold value) by which the comparator 9 in the level discriminator 3 senses an abnormal state in comparison with a sensed vibration level may be arbitrarily set, when the reference level is set to light the light emitting diode at the initial step of the wear of a bearing at which the bearing starts to vibrate abnormally, the abnormal wear and deterioration of the bearing can be found at its initial step only by a simple checking operation of visually confirming whether the light emitting diode is lit or not, so that the occurrence of a serious fault caused by the progress of the wear and deterioration can be prevented from happening.

Further, since the above embodiment shows an example that only one comparison reference value is set, the result of level discrimination indicates only normal (good) or abnormal (bad). However, the present invention is not limited thereto. For example, when two comparison reference values each having a different value are set and two comparators are provided to separately discriminate levels, respectively, three states of normal, caution needed and abnormal can be discriminated. As a result, three different states can be displayed by three light emitting diodes each having a different color.

Note, although deterioration such as wear and the like gradually grows worse, abnormal vibration resulting from the deterioration is not increased in proportion to the degree of wear but greatly changed regardless of it.

When the multivibrator 10 is driven in response to an output signal from a timer disposed in the level discriminator 3 which is supplied with the abnormal state sensing signal from the comparator 9 and keeps the signal for at least 24 hours, the light emitting diode is continuously lit for 24 hours when vibration from the accelerator sensor exceeds a certain level, so that the occurrence of wear deterioration can be found without overlooking it by visually confirming the state of the light emitting diode, for example, once a day.

As described above, according to the present invention, the acceleration sensing means outputs a sensing signal corresponding to a vibrating acceleration, the level discriminating means generates an output when the output level of the acceleration sensing means exceeds the preset reference level, and the display means displays the output of the level discriminating means. The piezoelectric ceramic power generating unit using the piezoelectric ceramics generates a charge when it is subjected to vibration, the direct current conversion means converts the charge generated by the piezoelectric ceramic power generating unit into DC power which is supplied to the level discriminating means and display means to sense and display the vibration. Consequently, all the power consumption in the vibration sensing apparatus can be covered by the power spontaneously generated in the apparatus, whereby the state of the bearing or the like of continuously operating equipment can be monitored at all times and the abnormal vibration of it can be securely sensed and displayed without the need of taking the life of a power source such as a battery or the like into consideration.

Further, according to the present invention, when the vibration sensing apparatus composed of the acceleration sensor, level discriminator, display unit, piezoelectric ceramic power generating unit and direct current conversion unit is mounted on each of a multiplicity of bearings or the like and the deterioration of the bearings, the wear deterioration of the bearings or the like can be found at their initial step by executing a visual check periodically, e.g., once a day. Consequently, time and labor necessary for check is reduced as compared with those conventionally required, so that productivity is improved as well as check cost is not needed, by which manufacturing cost is reduced.

According to the present invention, since the piezoelectric ceramic power generating unit is composed of the sheet-shaped piezoelectric ceramic elements arranged as the bimorph structure each having one end fixed and the other end provided with the deadweight and generates a charge by the bending vibration of the piezoelectric ceramic elements, when one of the elements is expanded, the other element is compressed. As a result, the elements can obtain a charge twice that obtained by a single element.

Further, the sheet-shaped piezoelectric ceramic elements generate a larger charge when they have a larger amount of a deflecting amplitude. Thus, the deflecting amplitude can be increased in such as manner that the deadweight is attached to the other end of the cantilevered vibration elements and the elements are resonated in the ordinary vibration frequency zone of a bearing or the like by adjusting the weight of the deadweight, by which a generated charge can be also increased.

What is claimed is:

1. A vibration sensing method comprising the steps of:
   (a) sensing a signal corresponding to a vibrating acceleration, and outputting the signal;
   (b) discriminating, usual a level discriminator, a level of the signal which is outputted in step (a) to generate an output when the level exceeds a preset reference level;
   (c) displaying the output generated in step (b) on a display unit;
   (d) providing a power generating unit having sheet-shaped piezoelectric ceramic elements arranged as a bimorph structure, one end of each of said piezoelectric ceramic elements being fixed, and a deadweight attached to another end of said piezoelectric ceramic elements, wherein the charge is generated by a bending vibration of said piezoelectric ceramic elements;
   (e) generating a charge by the power generating unit when vibration is applied thereto;
   (f) converting the charge generated by the power generating unit into DC power; and
   (g) supplying the converted DC power to the level discriminator and to the display unit as spontaneously generated power.

2. A vibration sensing apparatus, comprising:
   (a) an acceleration sensor for sensing a signal corresponding to a vibrating acceleration, and outputting the signal;
   (b) a level discriminator for discriminating a level of the signal outputted from said acceleration sensor and generating an output when said level exceeds a preset reference level;
   (c) a display unit for displaying the output of the level discriminator;
   (d) power generating unit which generates a charge when vibration is applied thereto, said power generating unit comprising:
   sheet-shaped piezoelectric ceramic elements arranged as a bimorph structure, one end of each of said piezoelectric ceramic elements being fixed, and
   a deadweight attached to another end of said piezoelectric ceramic elements, wherein the charge is generated by a bending vibration of said piezoelectric ceramic elements;
   (e) means for converting the charge generated by said power generating unit into DC power; and
   (f) means for supplying the converted DC power to said level discriminator and to said display unit as spontaneously generated power.

* * * * *